United States Patent
Iwai

(10) Patent No.: US 7,764,145 B2
(45) Date of Patent: Jul. 27, 2010

(54) PIEZOELECTRIC RESONATOR, METHOD OF MANUFACTURING THE SAME AND ELECTRONIC PART USING THE SAME

(75) Inventor: Yu Iwai, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 125 days.

(21) Appl. No.: 11/998,234

(22) Filed: Nov. 29, 2007

(65) Prior Publication Data
US 2008/0129415 A1 Jun. 5, 2008

(30) Foreign Application Priority Data
Nov. 30, 2006 (JP) .............................. 2006-324368

(51) Int. Cl.
H03H 9/21 (2006.01)
(52) U.S. Cl. ..................... 333/200; 333/188; 310/312; 310/370
(58) Field of Classification Search ............... 333/186, 333/188, 200; 310/312, 367, 370
See application file for complete search history.

(56) References Cited

U.S. PATENT DOCUMENTS

| | | | | |
|---|---|---|---|---|
| 3,683,213 A | * | 8/1972 | Staudte | 310/312 |
| 3,969,640 A | * | 7/1976 | Staudte | 310/312 |
| 4,320,320 A | * | 3/1982 | Momosaki et al. | 310/361 |
| 4,377,765 A | * | 3/1983 | Kogure et al. | 310/312 |
| 4,562,370 A | * | 12/1985 | Von Dach | 310/312 |
| 4,771,202 A | * | 9/1988 | Takahashi | 310/312 |
| 5,773,914 A | * | 6/1998 | Gottier | 310/344 |

FOREIGN PATENT DOCUMENTS

| JP | 57-53128 | * | 3/1982 | .................. 333/187 |
|---|---|---|---|---|
| JP | 58-90815 | * | 5/1983 | .................. 333/194 |
| JP | 2003-133885 | | 5/2003 | |

* cited by examiner

Primary Examiner—Barbara Summons
(74) Attorney, Agent, or Firm—Jordan and Hamburg LLP

(57) ABSTRACT

The object of the present invention is to provide a piezoelectric resonator of which vibration frequency can be accurately adjusted and the adjustment accuracy of the vibration frequency can be improved. The piezoelectric resonator of the present invention includes an vibrating arm extended from a base, and a metal film for adjusting frequency formed along the longitudinal direction from the tip of the vibrating arm, in which the metal film for adjusting frequency is provided with a block pattern divided into a plurality of blocks in compliance with the amount of frequency adjustment. Structuring as above, the frequency adjustment of the piezoelectric resonator is conducted by eliminating the blocks in compliance with the amount of frequency adjustment one by one, which makes it possible to adjust the vibration frequency with accuracy.

6 Claims, 9 Drawing Sheets

PIEZOELECTRIC RESONATOR, METHOD OF MANUFACTURING THE SAME AND ELECTRONIC PART USING THE SAME

BACKGROUND OF THE INVENTION

1. Field of the Invention

The present invention relates to a tuning fork type piezoelectric resonator made of, for instance, quartz crystal or the like, a method of manufacturing the same and an electronic part using the same.

2. Description of the Related Art

The tuning fork type quartz resonator has long been adopted as a signal source for pacing a wrist watch owing to its being compact, inexpensive and having a low power consumption, and the uses thereof are still expanding. The CI (crystal impedance) value of this quartz resonator is required to be as low as possible to reduce power loss, and a quartz resonator with a groove formed therein to enhance vibration efficiency is being used for this purpose.

The tuning fork type quartz resonator is provided with a pair of vibrating arms 2a and 2b on a base 1 as shown in FIG. 9, and grooves 31 and 32 are respectively provided on both main surfaces of the respective vibrating arms 2a and 2b. Excitation electrodes (not shown) for exciting fork vibration based on bending vibration are formed on these grooves 31, 32 and the respective vibrating arms 2a, 2b. Metal films 50a and 50b for adjusting frequency by adjusting the weight of the vibrating arms are formed on both front and back surfaces at the tips of the vibrating arms 2a and 2b.

The metal films 50a and 50b for adjusting frequency include a chromium (Cr) film 10, a gold (Au) film 11, and a chromium (Cr) film 13, which are stacked on the surface of the vibrating arms 2a and 2b in this order as shown in FIG. 10, and further include a gold (Au) film 12 serving as an adjusting weight being stacked further thereon. Incidentally, FIG. 10 is a schematic sectional view of a sectional part along the A-A line in FIG. 9. The metal films 50a and 50b for adjusting frequency thus structured are used to adjust the vibration frequency of the tuning fork type quartz resonator to, for instance, 32.768 kHz. Specific description of making adjustment to the vibration frequency is as follows. First, an oscillation circuit is connected to one quartz resonator among plural pieces of quartz resonators which are formed on a sheet of quartz wafer to measure the frequency before adjustment. Then, the metal films 50a and 50b for adjusting frequency are irradiated with a laser beam so that the gold (Au) film of the adjusting weight is sputtered to conduct rough adjustment to adjust the frequency close to 32 kHz. At this time, irradiation pulse number of the laser is counted. Thereafter, ionized argon particles obtained by discharging argon (Ar) are allowed to hit at the metal films 50a and 50b for adjusting frequency so that the gold (Au) film is sputtered to complete fine adjustment to the target frequency. The fine adjustment is conducted by sputtering the gold (Au) film with argon ions while monitoring the vibration frequency of the quartz resonator so as to adjust the thickness of the gold (Au) film. At this time, the irradiation amount of the argon (Ar) plasma is counted.

Next, based on the irradiation pulse number of the laser and the irradiation amount of the argon (Ar) plasma obtained from the above-described quartz resonator, the metal films 50a and 50b for adjusting frequency are shaved by a laser and argon (Ar) plasma for plural quartz resonators formed on a sheet of quartz wafer so as to match with the vibration frequency.

However, the above-described adjustment of the vibration frequency has the following problems. In a rough adjustment of the frequency of each quartz resonator, accurate positioning between the laser and the quartz wafer stage and degrees of melting of the metal films 50a and 50b for adjusting frequency with a laser are varied. Accordingly, time required for the rough adjustment is varied, which creates variation of time duration for the fine adjustment. When time for the fine adjustment is prolonged, time for irradiation with the argon (Ar) plasma also increases. As a result, the heating value of the quartz resonator increases. Since the vibration frequency of the tuning fork type quartz resonator is apt to be affected by heat, in other words, sensitive to heat, it is difficult to realize adjustment accuracy of high vibration frequency if the heating value varies in this manner.

Whereas the Patent Document 1 describes that the electrodes for finely adjusting frequency are formed in stripes on both front and back surfaces of a tuning fork arm, and, a beam of laser is allowed to irradiate the electrodes for finely adjusting frequency on the front surface of the tuning fork arm so as to perform fine adjustment of frequency. However, it is impossible to adjust the vibration frequency with high accuracy using this technology.

[Patent Document 1] Japanese Patent Application Laid-open 2003-133885 (paragraph 0040, FIG. 1)

SUMMARY OF THE INVENTION

The present invention has been achieved under such circumstances, and the objects thereof are to provide a piezoelectric resonator whose vibration frequency can be accurately adjusted so that the adjustment accuracy of the vibration frequency is improved, a method of manufacturing the same and electronic parts using the same.

A piezoelectric resonator of the present invention has an vibrating arm extended from a base, and is provided with metal films for adjusting frequency formed along the longitudinal direction at the tip of the vibrating arm, in which the above-described metal film for adjusting frequency includes a block pattern divided into a plurality of blocks.

In the above-described piezoelectric resonator, the aforementioned blocks may be provided in plurality in the longitudinal direction of the vibrating arm, or may be provided in plurality in the width direction of the vibrating arm. In addition, the blocks may be provided in plurality in the longitudinal and in the width directions of the vibrating arm or may include a plurality of block groups different in block size from each other. It is preferable that the metal films for adjusting frequency are formed on both front and back surfaces of the vibrating arm, and the block pattern formed on the front surface and that formed on the back surface correspond to each other. It is preferable that the above-described metal film for adjusting frequency includes a metal film for rough adjustment and a metal film for fine adjustment, and the block pattern is formed on the metal film for rough adjustment.

A method of manufacturing the piezoelectric resonator of the present invention includes the steps of:

forming an outer shape corresponding to a plurality of piezoelectric oscillating pieces from a piezoelectric substrate by etching, and forming grooves in plurality of vibrating arms extending from the base respectively;

forming the metal film for adjusting frequency at the tip of the vibrating arm;

forming a resist mask on the surface of the metal film to form a block pattern divided into more than one of blocks by etching the metal film;

removing the plurality of the blocks to perform rough adjustment of the vibration frequency; and performing fine adjustment of the vibration frequency by shaving the metal film at a position where no block pattern is formed to adjust the thickness thereof.

The electronic part of the present invention includes the piezoelectric resonator manufactured by the above-described method; a vessel to house the piezoelectric resonator; and an external electrode formed on the outer surface of the vessel and electrically connected to the electrode of the piezoelectric resonator.

In the present invention, a metal film for adjusting frequency is formed along the longitudinal direction from the tip of the vibrating arm, and a block pattern divided into a plurality of blocks in compliance with the amount of frequency adjustment is formed on the metal film for adjusting frequency. The frequency adjustment of the piezoelectric resonator is conducted by shaving the metal film for adjusting frequency formed on the vibrating arm. The frequency adjustment of the piezoelectric resonator in the present invention is conducted by eliminating the blocks in compliance with the amount of frequency adjustment one by one. As a result, it is possible to perform adjustment of the vibration frequency accurately so that the adjustment accuracy of the vibration frequency is improved.

DETAILED DESCRIPTION OF THE PREFERRED EMBODIMENT(S)

Figure 9:
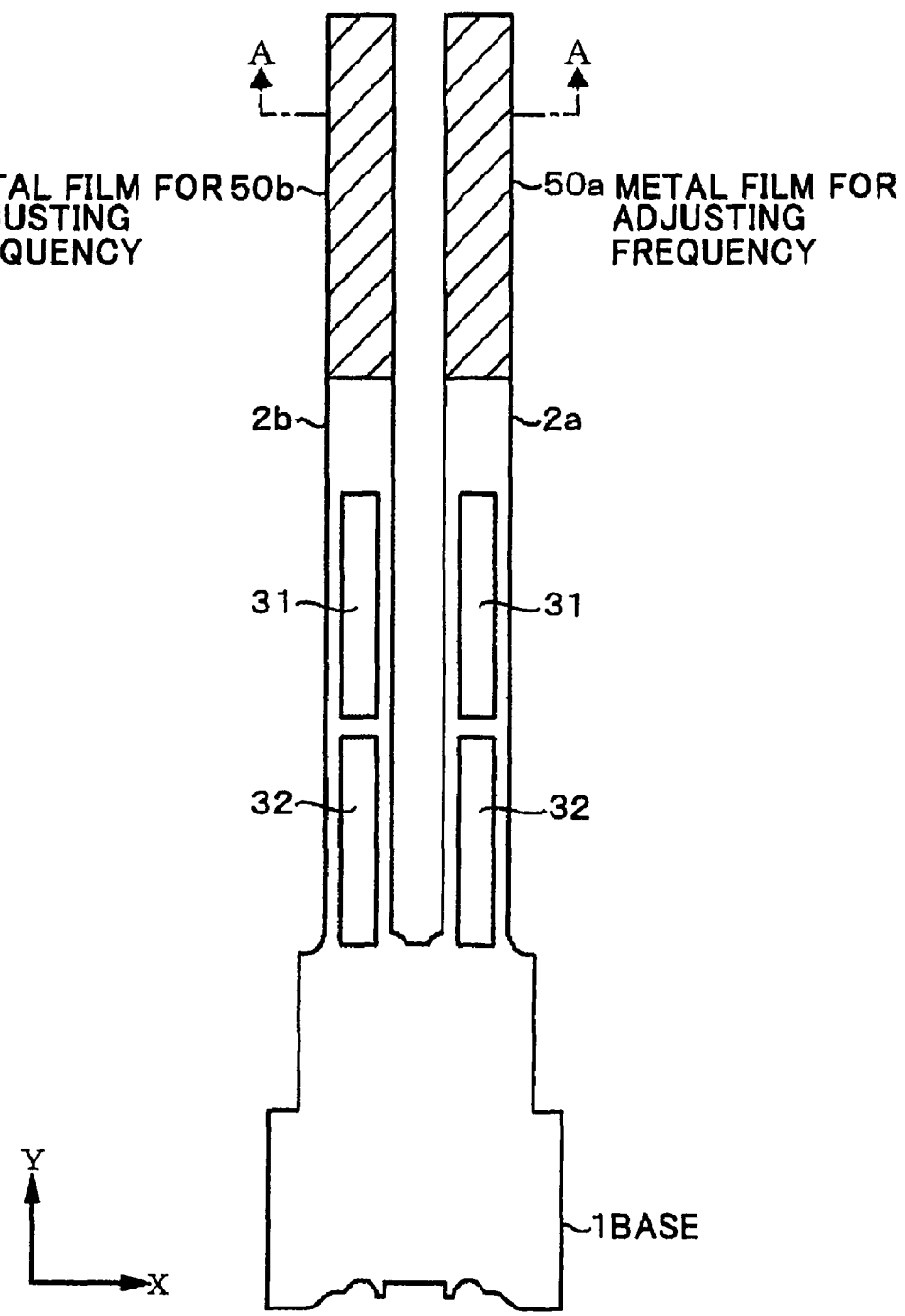
FIG. 9 is a schematic plan view showing an example of the tuning fork type quartz resonators.
Figure 10:
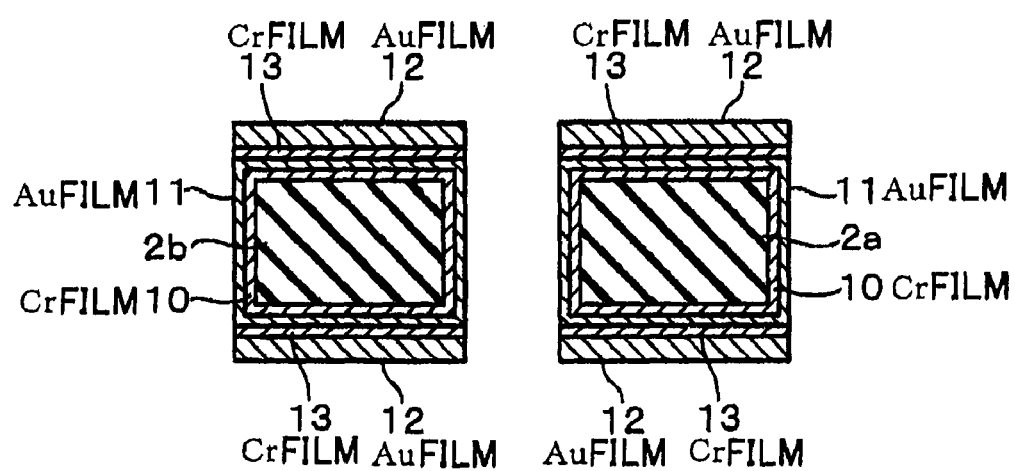
FIG. 10 is a schematic sectional view showing the section along the A-A line in FIG. 9.

An embodiment of the present invention will be explained. As for the structure of a quartz resonator being a piezoelectric resonator relating to the present embodiment, metal films 50a and 50b for adjusting frequency are formed on both front and back surfaces along the longitudinal direction from the tip of vibrating arms 2a and 2b, and a block pattern divided into a plurality of blocks in compliance with the amount of frequency adjustment is formed on the metal films 50a and 50b for adjusting frequency. Since other points excepting the above are the same as the quartz resonator explained in the section of related art using FIG. 9, explanation of these identical portions will be omitted, and parts of the same structure are attached with the same symbols and numerals.

Figure 1:
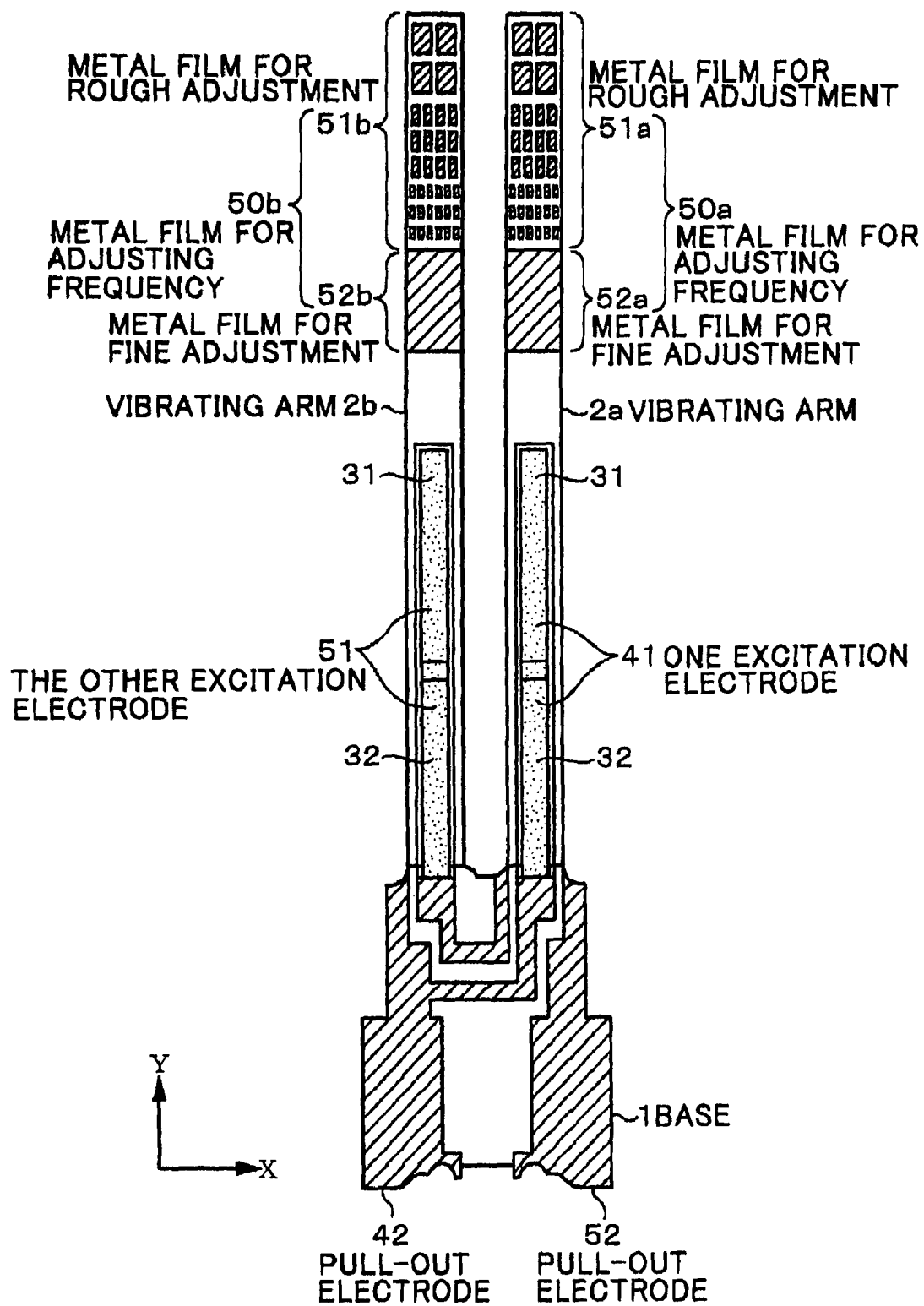
FIG. 1 is a schematic plan view showing an example of a tuning fork type quartz resonator relating to an embodiment of the present invention.
Figure 2:
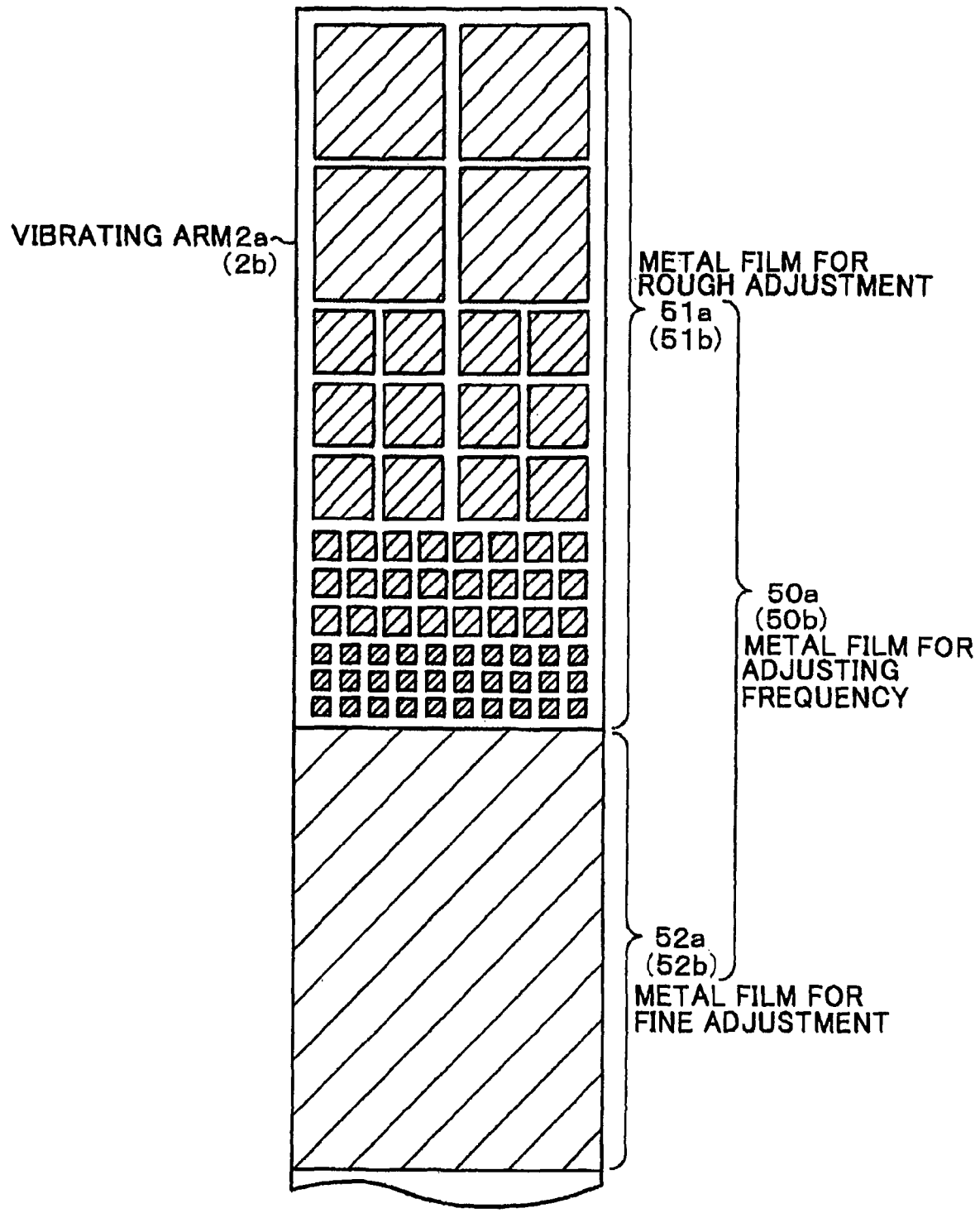
FIG. 2 is an enlarged view showing the tip of an vibrating arm of the above-described tuning fork type quartz resonator.

FIG. 1 is a schematic plan view of the quartz resonator relating to the embodiment of the present invention, and FIG. 2 is an enlarged view of the tip of the vibrating arms 2a (2b) of the quartz resonator. As shown in FIGS. 1 and 2, the metal films 50a and 50b for adjusting frequency, which are formed on both front and back surfaces of the tip of the vibrating arms 2a and 2b include metal films 51a and 51b for rough adjustment formed near the tip of the vibrating arms 2a and 2b, and metal films 52a and 52b for fine adjustment formed near the base of the vibrating arms 2a and 2b, and a block pattern divided into a plurality of blocks is formed on the metal films 51a and 51b for rough adjustment. In other words, the metal films 51a and 51b for rough adjustment are divided into blocks having a plurality of sizes, and as will be described later, an approximate amount of change in frequency at the time of eliminating the block is determined for every block. Note that, as shown in FIG. 2, rectangular blocks having different sizes are arranged from a block having a larger amount of frequency adjustment to a block having a smaller amount of frequency adjustment in sequence from the tip of the vibrating arms 2a and 2b toward the base in this example. These blocks include those having a surface area of, for instance, 10 μm×10 μm to 40 μm×40 μm. The shape of the block is not limited to a rectangle, but may be, for instance, a circle, a trapezoid, a triangle, and so on. As for the arrangement of the blocks, it is not limited to this example, they may be arranged from a block having the largest amount of frequency adjustment to those having smaller amounts in the width direction of the vibrating arms 2a and 2b in sequence, or, for instance, a block having a larger amount of frequency adjustment and a block having a smaller amount of frequency adjustment are made into one group, and such groups may be arranged from the tip of the vibrating arms 2a and 2b in the longitudinal direction. Note that, in a case where blocks having a size smaller than the diameter of the laser irradiating the metal films 50a and 50b for adjusting frequency are arranged vertically and horizontally, some space is taken between blocks lest a block adjacent to the block to be eliminated should be eliminated when the block is eliminated by the laser. In other words, the space between block patterns is adjusted in compliance with the diameter of the laser.

Returning the explanation to FIG. 1, the quartz resonator is composed of one electrode and the other electrode making a pair. Focusing on the vibrating arm 2a first, the one excitation electrode 41 is formed on the whole inner surface of two grooves 31, 32 of the vibrating arm 2a and a space between these grooves 31, 32. In other words, the excitation electrodes 41 in the respective grooves 31 and 32 of the vibrating arm 2a are connected via the excitation electrode 41 formed on, what is called, a bridge corresponding to the space between the grooves 31 and 32. The other excitation electrodes 51 (not shown) are formed on both side surfaces of the vibrating arm 2a.

Focusing on the vibrating arm 2b, the other excitation electrode 51 is formed on the whole inner surface of two grooves 31, 32 of the vibrating arm 2b and a space between these grooves 31, 32. The one excitation electrode 41 (not shown) is formed on both side surfaces of the vibrating arm 2b. The arrangements of the electrodes provided on the vibrating arms 2a and 2b are the same with each other except that the excitation electrodes 41 and 51 are in opposite relation. A pull-out electrode 42 is formed on the surface of a base 1 so that the one excitation electrode 41 and the one excitation electrode 41 are electrically connected, and a pull-out electrode 52 is formed on the surface of the base 1 so that the other excitation electrode 51 and the other excitation electrode 51 are connected. Note that the excitation electrodes 41, 51, the pull-out electrodes 42, 52, and the metal films 50a, 50b for adjusting frequency in FIGS. 1 and 2 are expressed by using slash lines and black dots separately for each area so that the drawing is easily seen. Accordingly, the slash lines in FIGS. 1 and 2 are not for expressing the sections of a quartz piece.

Figure 3A:
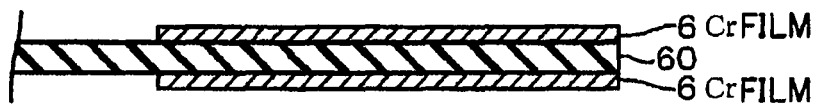
FIGS. 3A to 3F are schematic sectional views showing the method of manufacturing the tip of the above-described vibrating arm.
Figure 3B:
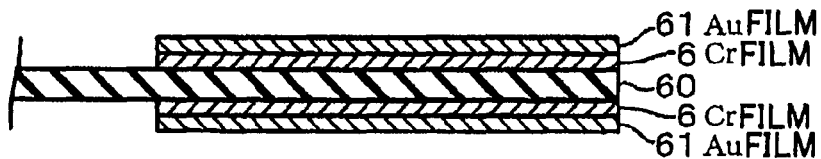
Figure 3C:
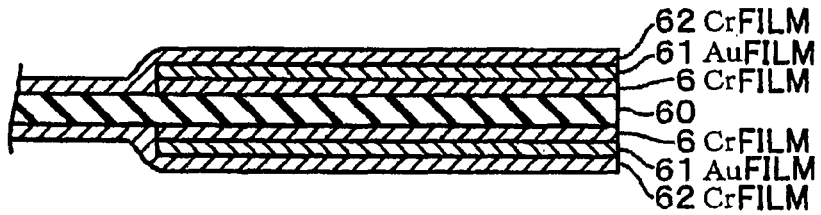
Figure 3D:
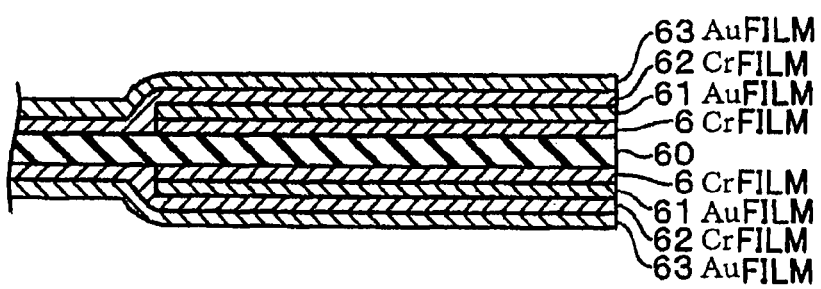
Figure 3E:
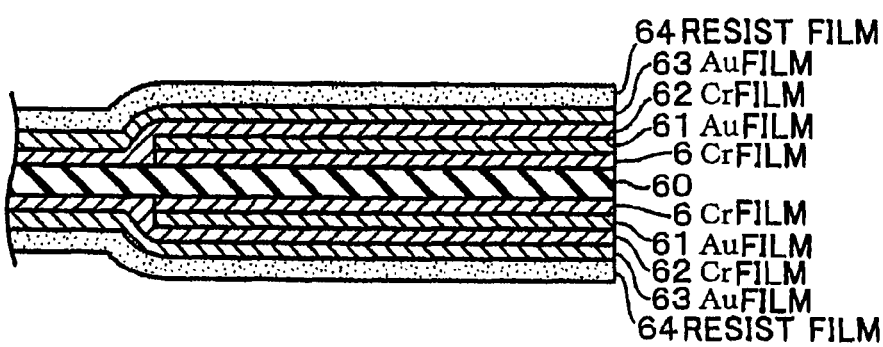
Figure 3F:
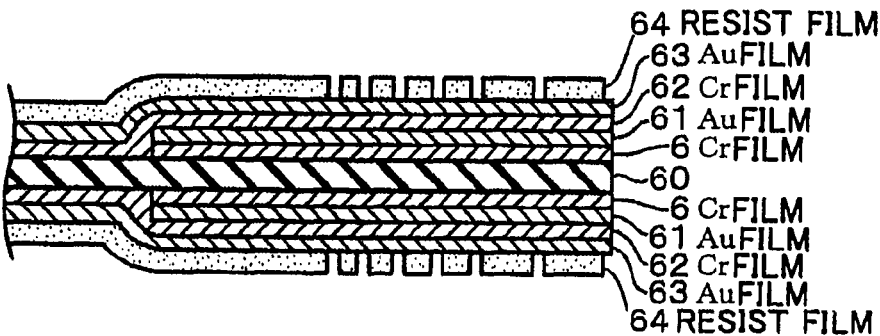
Figure 4G:
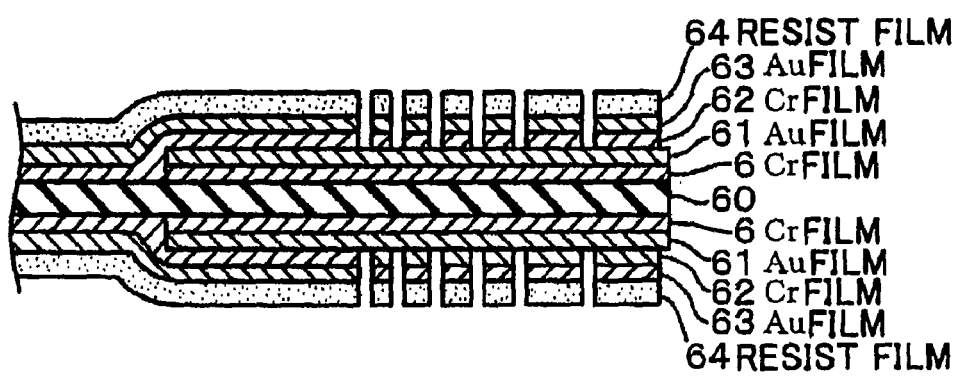
FIGS. 4G to 4I are schematic sectional views showing the method of manufacturing the tip of the above-described vibrating arm.
Figure 4H:
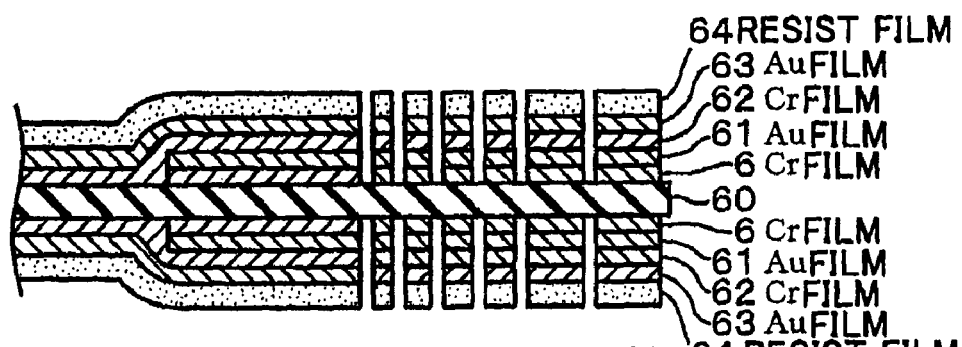

A method of manufacturing the quartz resonator shown in FIGS. 1 and 2 will be explained with reference to FIG. 3. Since the process of forming a quartz wafer in a tuning fork shape having grooves from a quartz wafer cut out along the X axis of quartz crystal is conducted by a known method combining photolithography and etching, the explanation of the process will be omitted, and the process of forming the metal film for adjusting frequency on the tip of the vibrating arms 2a and 2b and the following processes thereafter will be explained. FIG. 3 is a view showing a manufacturing process of the side surface parts of the vibrating arms 2a and 2b shown in FIG. 2. First, a metal film, for instance, a chromium (Cr) film 6, which is a backing film having good adherence to the quartz wafer, is formed on both front and back surfaces of the tip of the vibrating arms 2a and 2b in a thickness of, for instance, 50 Å to 500 Å by the sputtering method (FIG. 3A). Then, a metal film, for instance, a gold (Au) film 61 having good adherence to the metal film 6, is formed on the metal film 6 in a thickness of, for instance, 1000 Å to 10,000 Å by the sputtering method (FIG. 3B). To be precise, the metal films 6 and 61 are formed at the tips of the vibrating arms 2a and 2b by lithography. Next, a metal film, for instance, a chromium (Cr) film 62, which is a backing film having good adherence to the quartz wafer, is formed on the whole surface of the quartz wafer, namely, on both main surfaces and side surfaces of the quartz wafer in a thickness of, for instance, 50 Å to 500 Å by the sputtering method (FIG. 3C). Then, a metal film, for instance, a gold (Au) film 63 having good adherence to the metal film 62, is formed on the whole surface of the quartz wafer, namely, on both main surfaces and side surfaces of the quartz wafer in a thickness of, for instance, 500 Å to 2000 Å by the sputtering method (FIG. 3D). Thereafter, photoresist is applied on the whole surface of the quartz wafer by, for instance, the spray method to form a resist film 64 (FIG. 3E). Then, the resist film 64 except the resist film 64 for electrode patterns is eliminated (this state is not illustrated on the side surface side) by photolithography, and at the same time, the resist film 64 except the resist film 64 for block patterns is eliminated (FIG. 3F). Thereafter, the gold (Au) film 63 and the chromium (Cr) film 62 on the spots where the resist film 64 is eliminated are etched to form the electrode patterns and the block patterns (FIG. 4G). Next, the gold (Au) film 61 and the chromium (Cr) film 6 on the spots where the gold (Au) film 63 and the chromium (Cr) film 62 formed at the tip of the vibrating arms 2a and 2b are eliminated are etched to form block patterns (FIG. 4H). Thereafter, the resist film 64 left on the quartz wafer is completely eliminated (FIG. 4I).

Figure 4I:
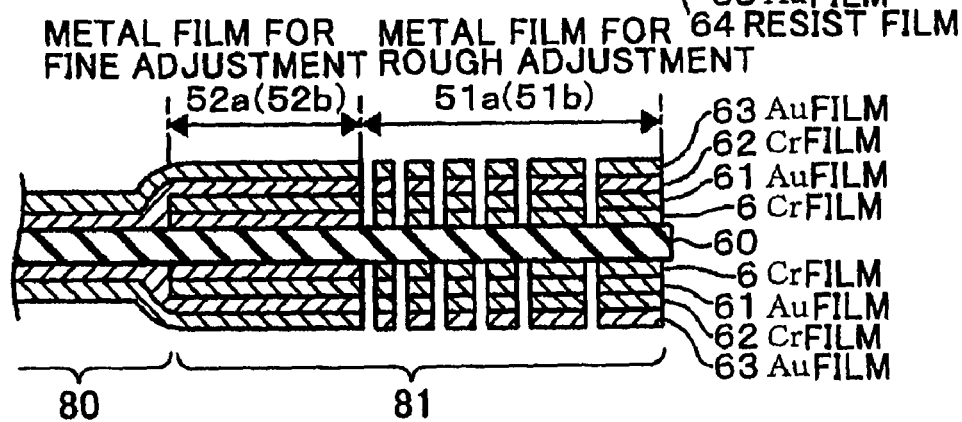

As shown in FIG. 4I, areas 80 where the chromium (Cr) film 62 and the gold (Au) film 63 are stacked in this order are metal films for electrodes (excitation electrodes 41, 51 and pull-out electrodes 42, 52), and areas 81 where the chromium (Cr) film 6, the gold (Au) film 61, the chromium (Cr) film 62, and the gold (Au) film 63 are stacked in this order are metal films 50a and 50b for adjusting frequency. In the metal films 50a and 50b for adjusting frequency, the areas where block patterns are formed on the metal films 6, 61, 62 and 63 are the metal films 51a and 51b for rough adjustment, and the areas where block patterns are not formed on the metal films 6, 61, 62 and 63 are the metal films 52a and 52b for fine adjustment. The metal films 51a, 51b for rough adjustment and the metal films 52a, 52b for fine adjustment structured in this manner are used for adjusting the vibration frequency of the tuning fork type quartz resonator to, for instance, 32.768 kHz.

Figure 5:
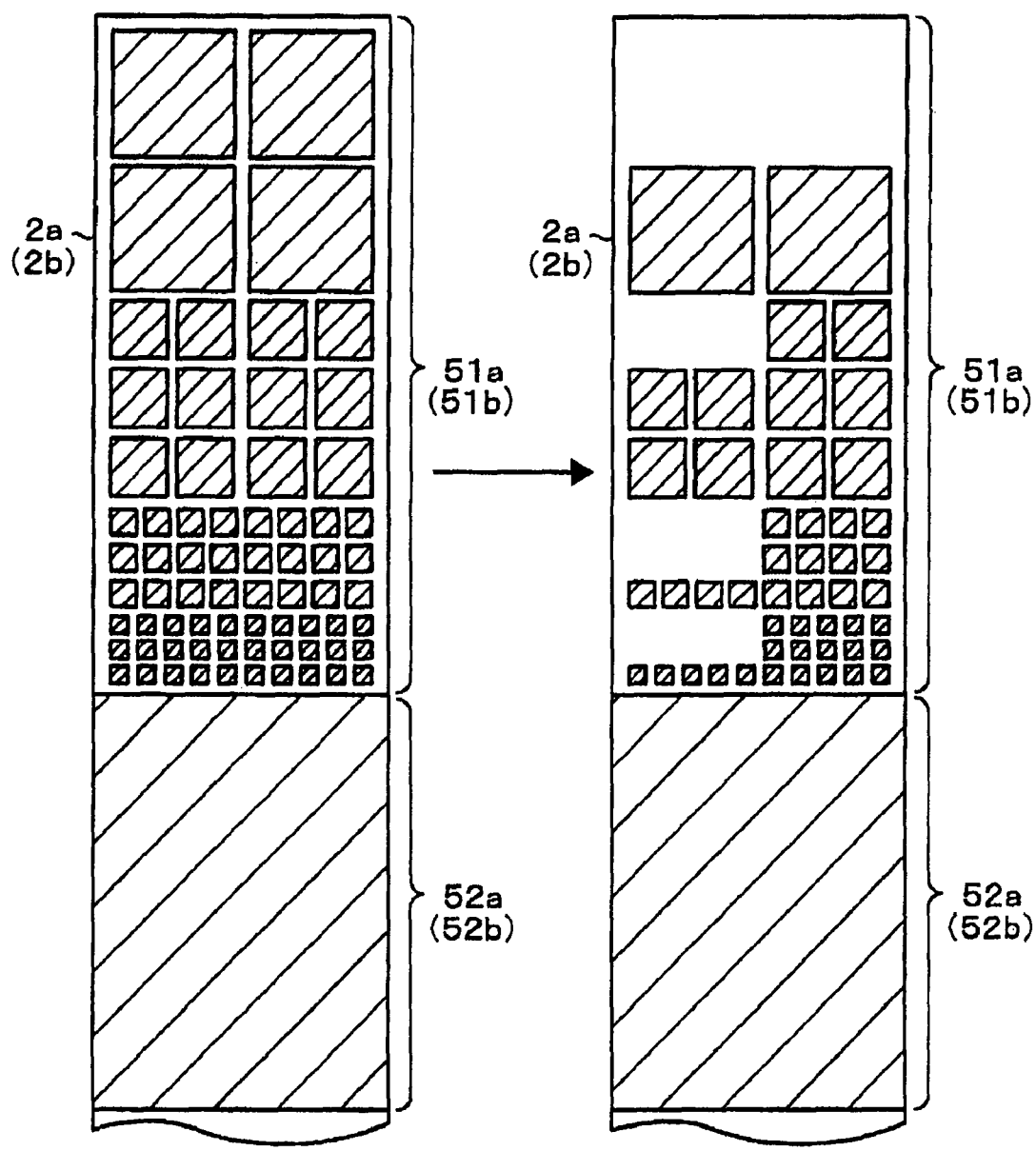
FIG. 5 is an explanatory view showing the manner of eliminating blocks necessary for matching with the target frequency by irradiating the blocks with a laser.
Figure 6:
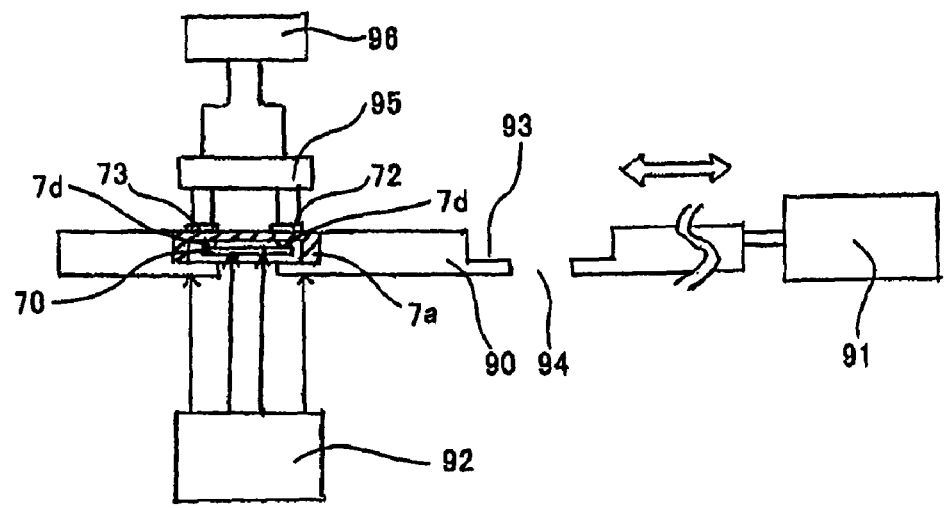
FIG. 6 is a schematic diagram of an apparatus used for performing fine adjustment.

Next, in the tip of the vibrating arms 2a and 2b, adjustment of the vibration frequency is conducted by shaving the surface of the metal films 50a and 50b for adjusting frequency formed on the tip with a laser or the like. Describing the adjustment of frequency more specifically, an oscillation circuit is connected to one quartz resonator among plural pieces of quartz resonators formed on a sheet of quartz wafer first, and the frequency before adjustment is measured. Next, blocks required for adjusting frequency to the target frequency is irradiated with a laser. In other words, when a block formed on one surface of the vibrating arms 2a and 2b is irradiated with a laser, the block formed on one surface is eliminated, and thereafter, the laser penetrates through the quartz wafer and irradiates the same sized block formed on the other surface of the vibrating arms 2a and 2b. In this embodiment, it becomes possible to adjust its frequency in the order of 500 ppm to 10 ppm by irradiating a block pattern formed on the metal films 51a and 51b for rough adjustment with a laser to eliminate the block pattern. Thus, the same block formed on both front and back surfaces of the vibrating arms 2a and 2b are eliminated to conduct rough adjustment so as to bring its frequency close to 32 kMz (refer to FIG. 5). The number of blocks eliminated at this time is counted. Thereafter, one piece of the quartz resonator is cut out from the quartz wafer, argon particles prepared by discharging and ionizing argon (Ar) are allowed to hit on the metal films 52a and 52b for fine adjustment formed on one surface of the vibrating arms 2a and 2b of the cut out quartz resonator so as to gradually sputter the gold (Au) film 63 to conduct fine adjustment to the target frequency. For this fine adjustment, as shown in FIG. 6, an apparatus mainly composed of a tray 90 made of metal such as SUS or the like and being capable of holding a plurality of the quartz resonators, a drive means 91 capable of sliding the tray 90 in a prescribed direction, and an ion gun 92 irradiating charged particle beams (argon ion beam) to the vibrating arms 2a and 2b of the quartz resonator held by the tray 90, is used.

Figure 7:
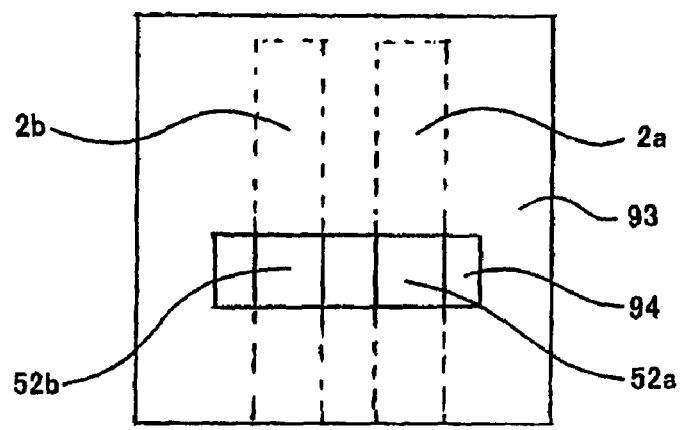
FIG. 7 is an explanatory view showing a tray which serves to limit the irradiation area of an argon ion beam.
Figure 8A:
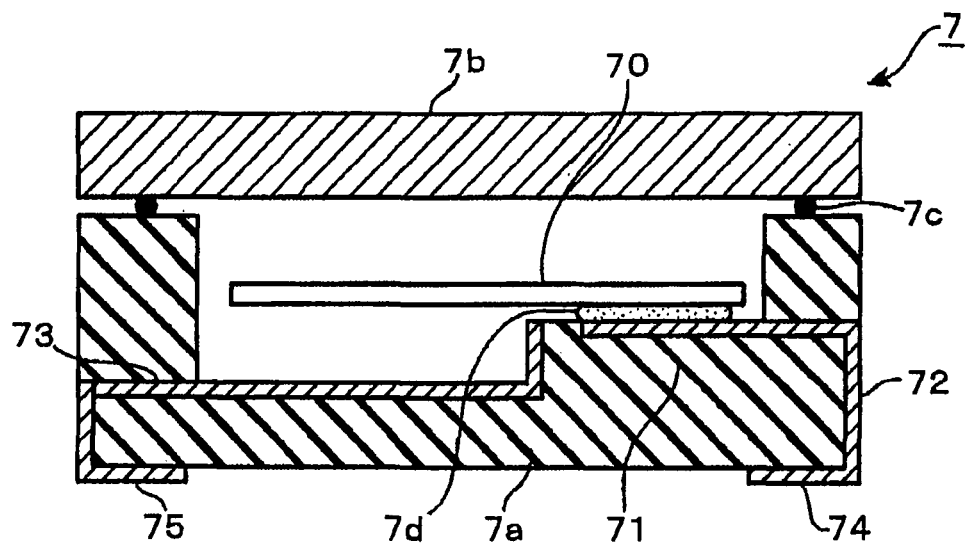
FIGS. 8A and 8B are a schematic vertical sectional view and a schematic back view showing an example of an electronic part that houses the tuning fork type quartz resonator relating to an embodiment of the present invention.
Figure 8B:
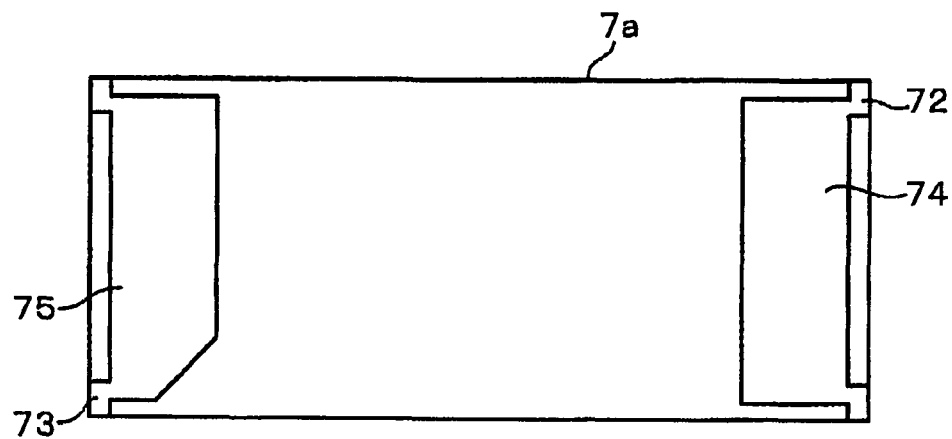

The above-described tray 90 is provided with a recessed 93 capable of fitting a case 7a which houses the quartz resonator as shown in FIG. 8 to be described later, and an opening 94 is provided at the position where the meat films for fine adjustment 52a and 52b of the quartz resonator as shown in FIG. 7 on the bottom of the recess 93. The case 7a is fitted into the recess 93 of the tray 90 formed as described above such that the opening of the case 7a faces toward the bottom side of the recess 93. This structure makes it possible to get an unobstructed view of the metal film 52a and 52b of the quartz resonator from the outside through the opening 94 at the bottom of the recess 93. Then, the argon ion beam from the ion gun 92 provided on the bottom side of the tray 90 hits the metal film 52a and 52b for fine adjustment of the quartz resonator through the opening 94 of the tray 90. That is, the tray 90 works as a mask.

In an apparatus of such a structure, when conducting fine adjustment, one piece of roughly adjusted quartz resonator from the quarts wafer first, and the quartz resonator is bonded to the bottom of the case 7a with a conductive adhesive 7d. Next, the case 7a is placed in the recess 93 of the tray 90. Then it is irradiated with the argon ion beam from the ion gun 92. Since the irradiation area of the argon ion beam is limited by the tray 90, only the metal film 52a and 52b for fine adjustment of the quartz resonator are eliminated. An electrode pad 95 is connected to electrodes 72 and 73 arranged on the outside bottom of the case 7a, and by sputtering the gold (Au)

film 63 with argon ions while monitoring the vibration frequency of the quartz resonator using a frequency measuring instrument 96 via the electrode pad 95 so as to adjust the film thickness of the gold (Au) film 63. The irradiation amount of the argon (Ar) plasma at this time is counted.

Next, based on the number of eliminated blocks and the irradiation amount of the argon (Ar) plasma obtained from the quartz resonator, matching of the vibration frequency is conducted for a plurality of quartz resonators formed on a sheet of quartz wafer. That is, the same amount of the blocks are eliminated in the metal films 51a and 51b for rough adjustment of each quartz resonator, and the same amount of argon (Ar) plasma is allowed to beam at the metal films 52a and 52b for fine adjustment of each quartz resonator. Explaining concretely, first, plural quartz resonators formed on a sheet of quartz wafer are roughly adjusted respectively. Then, all quartz resonators are cut out from the sheet of the quartz wafer and housed in the cases 7a respectively. Then, these cases 7a are arranged in the recesses 93 of the trays 90 respectively, and the trays 90 are transferred from the right side to the left side in FIG. 7 in turn by the drive means 91 so as to match the respective openings 94 of the trays 90 with the irradiating point of the ion gun 92. By this process, fine adjustment is conducted for each quartz resonator.

According to the above-described embodiment, adjustment of the vibration frequency of the quartz resonator is conducted by eliminating the blocks of which approximate amounts of change in frequency are known one by one. As a result, it becomes possible to perform adjustment of the vibration frequency accurately so that the adjustment accuracy of the vibration frequency is improved. It also becomes possible to perform rough adjustment without being affected by various variations by eliminating blocks required for matching the frequency to the target frequency with a laser irradiation. Further, it is possible to easily calculate the amount of rough adjustment of frequency by checking the eliminated blocks. In addition, since the frequency after the rough adjustment of frequency is stabilized, the difference in the amount of frequency adjustment at the time of fine adjustment among the respective quartz resonators is reduced, and the heat effect is made uniform, so that the variations in final frequency are diminished.

The adjustment of the frequency may be conducted as follows. First, a piece of quartz resonator is cut out from plural pieces of quartz resonators formed in one sheet of quartz wafer, this one piece of the quartz resonator is set in an oscillation circuit, and the frequency is measured under the condition that the metal films 51a, 51b for rough adjustment and the metal films 52a and 52b for fine adjustment are arranged. Then, the difference between the measured frequency and the target frequency, 32.768 kHz, is calculated. Next, based on the difference between the measured frequency and the target frequency, among the metal films 51a and 51b for rough adjustment, the blocks required for matching with the target frequency are irradiated with a laser. Then, rough adjustment is conducted by eliminating the same sized blocks formed on both front and back surfaces of the vibrating arms 2a and 2b so that the frequency is brought close to 32 kHz. Thereafter, similarly to the above, ionized argon particles obtained by discharging argon (Ar) are allowed to beam at the metal films 52a and 52b for fine adjustment formed on one surface of the vibrating arms 2a and 2b so that the gold (Au) film 63 is sputtered to conduct fine adjustment to the target frequency. Such a frequency adjustment is conducted for cut-out quartz resonators in sequence.

It should be noted that in the above-described embodiment, the metal films 50a and 50b for adjusting frequency are formed on both front and back surfaces of the vibrating arms 2a and 2b, it is also possible to form the metal films 50a and 50b for adjusting frequency only on the front surface of the vibrating arms 2a and 2b. Furthermore, the fine adjustment process may be performed with a laser.

The quartz resonator, for which adjustment of the vibration frequency has been completed as described above is housed, for instance, as shown in FIG. 8, in a package 7 made of ceramics in a surface mounted device (SMD) structure. The package 7 includes a case 7a made of, for instance, ceramics, of which upper surface is open, and a lid 7b made of, for instance, metal. The above-described case 7a and the lid 7b are seam-welded via a sealing compound 7c made from, for instance, a welding material, and the inside thereof is maintained under vacuum. The above-described tuning fork type quartz resonator 70 is placed in the package 7 in the following manner that the pull-out electrodes 42 and 52 of the base 1 are fixed on a pedestal 71 placed in the inside of the package 7 via a conductive adhesive 7d, and the quartz resonator 70 is fixed on the pedestal 71 in a horizontal posture in which the vibrating arms 2a and 2b are extending into a space inside the package 7. In addition, conductive paths 72 and 73 (73 is a conductive path on the inner side of the paper) are wired on the surface of the above-described pedestal 71, the pull-out electrodes 42 and 52 of the base 1 are connected to the above-described conductive paths 72 and 73 via the conductive adhesive 7d. The conductive paths 72 and 73 are connected to electrodes 74 and 75, which are arranged to face in the longitudinal direction of the outside bottom surface of the case 7a. Owing to this structure, the quartz resonator is oscillated by application of a voltage to the pull-out electrodes 42 and 52 of the base 1 through the electrodes 74, 75, the conductive paths 72, 73, and the conductive adhesive 7d. Electric parts are composed in this manner, and the electric part is installed on a circuit board (not shown) on which circuit parts of an oscillation circuit are installed.

What is claimed is:

1. A piezoelectric resonator comprising:
   a base;
   a vibrating arm extended from the base in a longitudinal direction to a tip portion and the arm extending in a width direction orthogonal to the longitudinal direction;
   a metal film for adjusting frequency formed at the tip portion of the vibrating arm;
   said metal film for adjusting frequency being provided with:
     a first block pattern comprised of a plurality of first blocks each having a first area such that the first blocks are equal to each other in area and arranged adjacent each other in the width direction; and
     a second block pattern provided displaced from the first block pattern in the longitudinal direction, the second block pattern being comprised of a plurality of second blocks each having a second area such that the second blocks are equal to each other in area and are arranged adjacent each other in the width direction, said second area being different in size from said first area; and
   said first blocks are spaced apart from each other and said second blocks are spaced apart from each other a distance sufficient to permit removal of one of either of said first and second blocks by laser operation without affecting an adjacent one of said first and second blocks.

2. The piezoelectric resonator according to claim 1, wherein said first area is greater than said second area, and said second blocks are closer to the base in the longitudinal direction of said vibrating arm than the first blocks.

3. The piezoelectric resonator according to claim 1, wherein said first blocks are square and arranged in a matrix pattern, and said second blocks are square and arranged in a matrix pattern.

4. The piezoelectric resonator according to any one of claim 1 to claim 3,
wherein said arm has a front surface and a back surface and said metal film for adjusting frequency includes first and second film portions that are respectively formed on both the front and back surfaces of the vibrating arm, and
wherein the block pattern formed on said front surface corresponds to the block pattern formed on said back surface.

5. The piezoelectric resonator according to any one of claim 1 to claim 3,
wherein said first and second block patterns are configured for rough adjustment of frequency and said arm includes a further metal film for fine frequency adjustment provided closer to said base than said first and second block patterns and constituting a larger area than each of said first and second block patterns and said further metal film being not divided into blocks.

6. An electronic part, comprising:
the piezoelectric resonator according to any one of claim 1 to claim 3 and including an electrode;
a vessel to house said piezoelectric resonator; and
an external electrode formed on an outer surface of said vessel and electrically connected to the electrode of said piezoelectric resonator.

* * * * *